(12) United States Patent
Masui et al.

(10) Patent No.: US 8,995,492 B2
(45) Date of Patent: Mar. 31, 2015

(54) SEMICONDUCTOR LASER ELEMENT

(75) Inventors: Shingo Masui, Tokushima (JP); Yasuhiro Kawata, Anan (JP); Hideyuki Fujimoto, Anan (JP); Atsuo Michiue, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/130,896

(22) PCT Filed: Jul. 4, 2012

(86) PCT No.: PCT/JP2012/067051
§ 371 (c)(1),
(2), (4) Date: Jan. 3, 2014

(87) PCT Pub. No.: WO2013/005759
PCT Pub. Date: Jan. 10, 2013

(65) Prior Publication Data
US 2014/0140362 A1    May 22, 2014

(30) Foreign Application Priority Data

Jul. 5, 2011   (JP) .................................. 2011-148763

(51) Int. Cl.
| | |
|---|---|
| H01S 5/00 | (2006.01) |
| H01S 5/22 | (2006.01) |
| H01S 5/022 | (2006.01) |
| H01S 5/042 | (2006.01) |
| B82Y 20/00 | (2011.01) |
| H01S 5/02 | (2006.01) |

(Continued)

(52) U.S. Cl.
CPC ................ *H01S 5/22* (2013.01); *H01S 5/0224* (2013.01); *H01S 5/0425* (2013.01); *B82Y 20/00* (2013.01); *H01S 5/0014* (2013.01); *H01S 5/0021* (2013.01); *H01S 5/0202* (2013.01); *H01S 5/02476* (2013.01); *H01S 5/028* (2013.01);

(Continued)

(58) Field of Classification Search
USPC ....................................................... 372/45.01
See application file for complete search history.

(56) References Cited

U.S. PATENT DOCUMENTS 6,995,406 B2 * 2/2006 Tojo et al. ...................... 257/103
7,408,199 B2 * 8/2008 Matsuyama et al. ............ 257/79

(Continued)

FOREIGN PATENT DOCUMENTS

| JP | 2004-140141 A | 5/2004 |
|---|---|---|
| JP | 2008-270707 A | 11/2008 |

(Continued)

OTHER PUBLICATIONS

International Search Report dated Jul. 31, 2012 received in International Application No. PCT/JP2012/067051.

*Primary Examiner* — Colleen A Matthews
*Assistant Examiner* — Vu A Vu
(74) *Attorney, Agent, or Firm* — Foley & Lardner LLP

(57) ABSTRACT

To provide a ridge-type semiconductor laser element capable of preventing inclination at the time of junction-down bonding and having high heat dissipation, in a semiconductor laser element including a substrate, a semiconductor portion disposed on the substrate and having a ridge on a surface at an opposite side from the substrate, an electrode disposed on a ridge, an insulating layer disposed on the semiconductor portion at the both sides of the ridge and a pad electrode disposed on the electrode, in which, the pad electrode side is a mounting surface side, the pad electrode is disposed extending on the insulating layer, and a spacer is disposed between the semiconductor portion and the pad electrode at parts spaced apart from the ridge.

20 Claims, 7 Drawing Sheets

(51) Int. Cl.
  *H01S 5/024* (2006.01)
  *H01S 5/028* (2006.01)
  *H01S 5/343* (2006.01)

(52) U.S. Cl.
  CPC ...... *H01S 5/34333* (2013.01); *H01S 2301/176* (2013.01); *H01S 5/02272* (2013.01); *H01S 2301/173* (2013.01)
  USPC ..................................................... 372/45.01

(56) References Cited

U.S. PATENT DOCUMENTS

| | | | |
|---|---|---|---|
| 7,646,798 B2* | 1/2010 | Michiue et al. | 372/49.01 |
| 7,842,956 B2* | 11/2010 | Ohmi et al. | 257/79 |
| 7,916,766 B2* | 3/2011 | Hata et al. | 372/50.12 |
| 2007/0165686 A1* | 7/2007 | Miyazaki | 372/46.01 |
| 2007/0217458 A1* | 9/2007 | Kitano et al. | 372/43.01 |
| 2008/0240187 A1* | 10/2008 | Hata et al. | 372/43.01 |
| 2009/0086780 A1* | 4/2009 | Murasawa et al. | 372/46.01 |
| 2009/0200571 A1 | 8/2009 | Ishida | |
| 2010/0034234 A1* | 2/2010 | Hata et al. | 372/50.12 |
| 2010/0189146 A1* | 7/2010 | Bessho et al. | 372/43.01 |
| 2011/0198644 A1 | 8/2011 | Hwang et al. | |

FOREIGN PATENT DOCUMENTS

| | | |
|---|---|---|
| JP | 2010-108965 A | 5/2010 |
| JP | 2011-171740 A | 9/2011 |
| WO | WO-2009/034928 A1 | 3/2009 |

* cited by examiner

SEMICONDUCTOR LASER ELEMENT

CROSS-REFERENCE TO RELATED APPLICATIONS

This application is the U.S. National Phase Entry Application of PCT/JP2012/067051 filed Jul. 4, 2012, which claims priority from Japanese Patent Application No. 2011-148763 filed Jul. 5, 2011. The subject matter of each of the above-referenced applications is hereby incorporated by reference in its entirety.

BACKGROUND OF THE INVENTION

1. Technical Field

The present invention relates to a semiconductor laser element.

2. Description of Background Art

For a technique to improve heat dissipation of a semiconductor laser element, a junction-down bonding has been known. A junction-down bonding is a technique for mounting a ridge side on a submount etc (for example, described in JP 2004-140141A).

Patent literature 1: Japanese Unexamined Patent Application Publication No. 2004-140141A

DISCLOSURE OF INVENTION

Problem to be Solved by the Invention

However, various problems may arise in performing such junction-down bonding. For example, in paragraph 13 of Patent Literature 1, a tendency of inclination of a semiconductor laser element with respect to a submount due to a protruded shape of a ridge is described.

The present invention is devised to solve the above-described problem, and an object therefore is to provide a ridge-type semiconductor laser element which can prevent inclination at the time of junction-down bonding and also has a high heat dissipation.

Means to Solve the Problems

A semiconductor laser element according to the present invention includes a substrate, a semiconductor portion disposed on the substrate and having a ridge on a surface at an opposite side from the substrate, an electrode disposed on the ridge, an insulating layer disposed on the semiconductor portion at both sides of the ridge, and a pad electrode disposed on the electrode, and a pad electrode side is amounting surface side. The pad electrode is disposed extending above the insulating layer, and a spacer is arranged between the semiconductor portion and the pad electrode, at a part spaced apart from the ridge.

Effect of the Invention

At the time of junction-down mounting, the semiconductor laser element according to the present invention having a structure as described above is held on the supporting member by the surface of the pad electrode disposed on the ridge and the surface of the pad electrode disposed on the spacer, so that inclination can be prevented when performing junction-down bonding. That is, in the case where the spacer is not provided, teetering may occur centering on the ridge due to the structure in which the both sides of the ridge decrease in height, resulting in inclination in the bonding. However, in the present invention, a spacer is provided at locations spaced away from the ridge, so that at the time of mounting, the semiconductor laser element can be held by at least the ridge and the spacer, which allows junction-down bonding without creating inclination. Further, in the semiconductor laser element according to the present invention, the spacer is disposed on a part between the semiconductor portion and the pad electrode, which is spaced apart from the ridge. Thus, heat dissipation will not to be deteriorated as in the case where the spacer is disposed on approximately entire surfaces of the spacer on the both sides of the ridge.

DETAILED DESCRIPTION OF EMBODIMENTS

Figure 1:
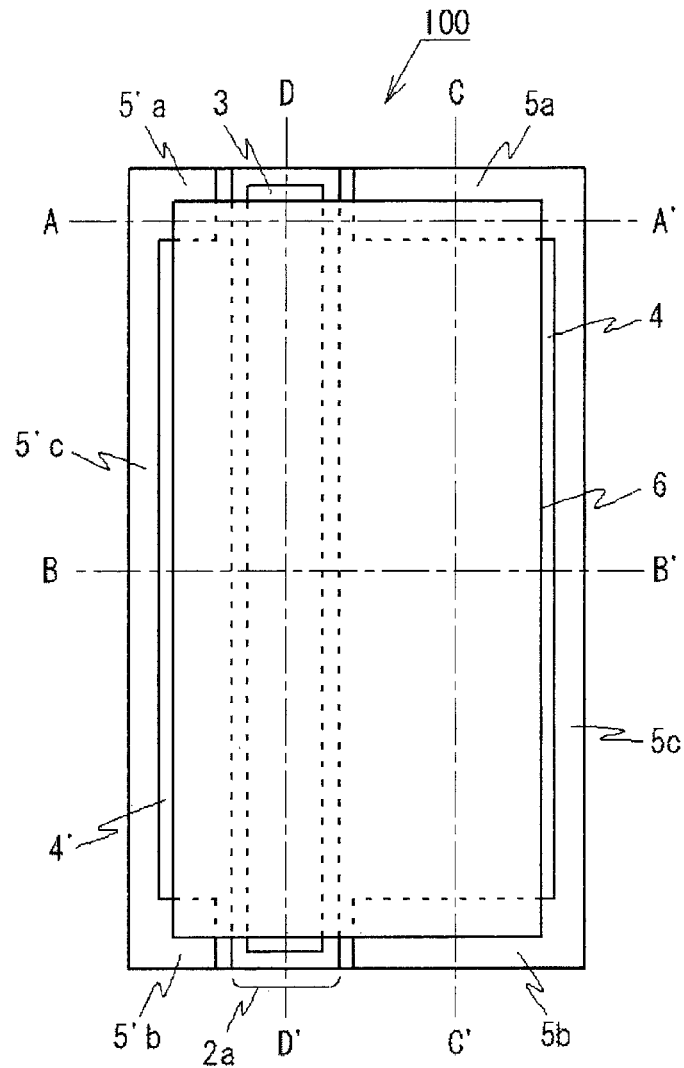
FIG. 1 is a plan view of a semiconductor laser element according to Embodiment 1.

The embodiments for implementing a semiconductor laser element according to the present invention will be described below with reference to the drawings. The embodiments shown below are intended as illustrative to give a concrete form to technical ideas of the present invention, and the scope of the present invention is not limited to those described below. The sizes and the arrangement relationships of the members in each of drawings are occasionally shown exaggerated for ease of explanation. In the description below, the same designations or the same reference numerals denote the same or like members and duplicative descriptions will be appropriately omitted.

Figure 2:
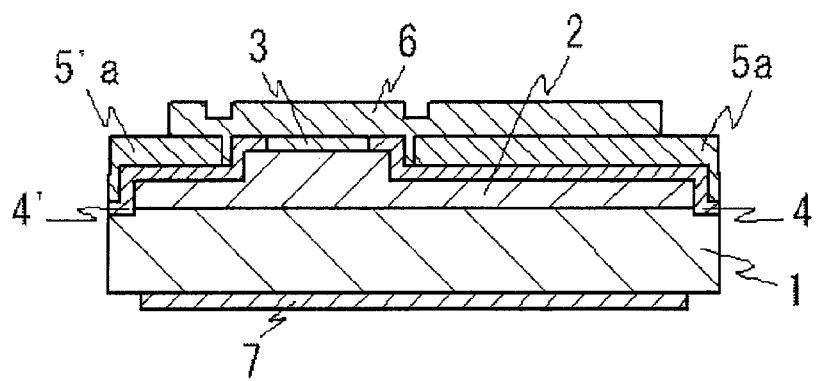
FIG. 2 is a cross-sectional view taken along alternate long and short dashed line A-A' of FIG. 1.
Figure 3:
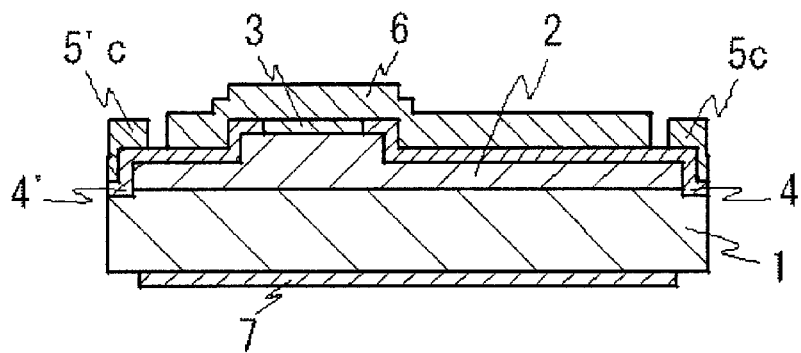
FIG. 3 is a cross-sectional view taken along alternate long and short dashed line B-B' of FIG. 1.
Figure 4:
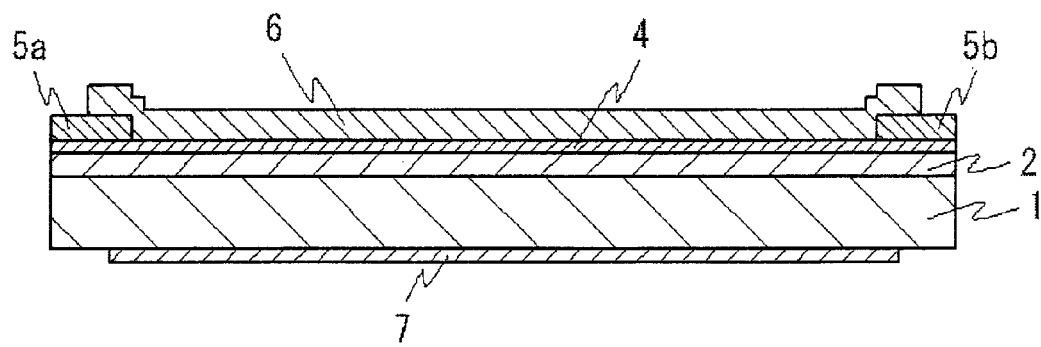
FIG. 4 is a cross-sectional view taken along alternate long and short dashed line C-C' of FIG. 1.
Figure 5:
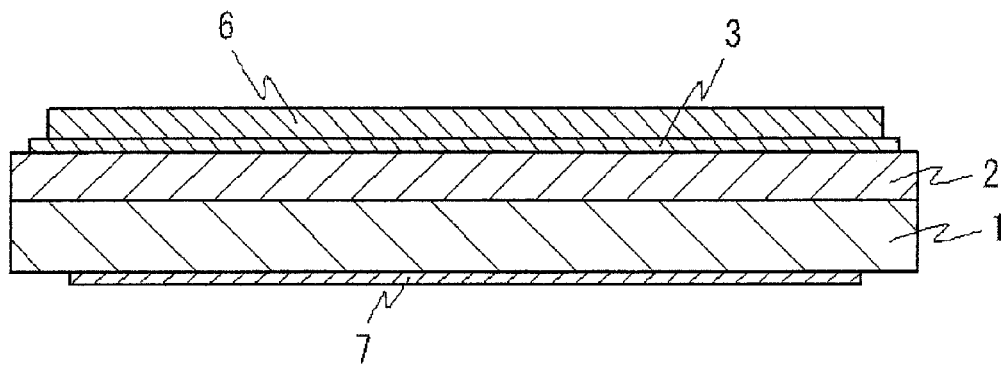
FIG. 5 is a cross-sectional view taken along alternate long and short dashed line D-D' of FIG. 1.

FIG. 1 is a plan view of a semiconductor laser element 100 of an edge-emitting type according to an embodiment of the present invention as seen from above, FIG. 2 is a cross-sectional view taken along alternate long and short dashed line A-A' of FIG. 1, FIG. 3 is a cross-sectional view taken along alternate long and short dashed line B-B' of FIG. 1, FIG. 4 is a cross-sectional view taken along alternate long and short dashed line C-C' of FIG. 1, and FIG. 5 is a cross-sectional view taken along alternate long and short dashed line D-D' of FIG. 1. For the simplicity of explanation, in the present specification, the lower side in the cross-sectional views shown in FIG. 2 to FIG. 4 is described as "lower", and the upper side in the cross-sectional views shown in FIG. 2 to FIG. 4 is described as "upper". It is needless to say that those positional relationships are sufficient in relative magnitudes, and thus, for example, even if each figure is turned upside down, still falls within the scope of the present invention.

The semiconductor laser element 100 includes, as shown in FIG. 2, a substrate 1, a semiconductor portion 2 having a ridge 2a on the upper side and disposed on the substrate, an electrode 3 disposed on the ridge 2a, insulating layers 4 and 4' disposed on each side of the ridge 2a respectively, and a pad electrode 6 disposed on the electrode 3. Also, the semiconductor laser element 100 is designed for so-called junction-down mounting with the pad electrode 6-side serving as a mounting surface side. In the semiconductor laser element 100, a spacer which includes a first spacer 5a and a second spacer 5b is disposed on parts of the insulating layer 4, and in a similar manner, a spacer which includes a first spacer 5'a and a second spacer 5'b is disposed on parts of the insulating layer 4'. In the present embodiment, the first spacer 5a and the first spacer 5'a are disposed on each side of the ridge 2a and spaced apart from each other, in the vicinity of the emitting end surface, and the second spacer 5b and the second spacer 5'b are disposed on each side of the ridge 2a and spaced apart from each other, in the vicinity of the reflecting end surface. The pad electrode 6 is disposed on the electrode 3 and the insulating layers 4 and 4' so as to cover a part of the first spacer 5a, a part of the first spacer 5'a, a part of the second spacer 5b, and a part of the second spacer 5'b. In the semiconductor laser element according to the present embodiment having a structure as described above, the heights of parts of the upper surface of the pad electrode disposed on the first spacer 5a, the first spacer 5'a, the second spacer 5b, and the second spacer 5'b are higher than the heights of parts of the pad electrode disposed on the insulating layer which is formed at a location not provided with a spacer, and accordingly, junction-down bonding without creating inclination of the semiconductor laser element 100 can be obtained. The first spacer 5a, the first spacer 5'a, the second spacer 5b, and the second spacer 5'b are preferably formed with a thickness approximate to the height of the upper electrode 3. With this arrangement, the height of the pad electrode formed on the first spacer 5a, the first spacer 5'a, the second spacer 5b, and the second spacer 5'b and the height of the pad electrode 6 formed on the ridge (on the electrode 3) can be made approximately the same, so that inclination of the semiconductor laser element 100 can be prevented more efficiently.

As described above, with the semiconductor laser element according to the present embodiment, inclination of the semiconductor laser element 100 at the time of junction-down bonding can be prevented and moreover, heat dissipation can be further improved. Hereinafter, embodiments will be described in detail.

Figure 6:
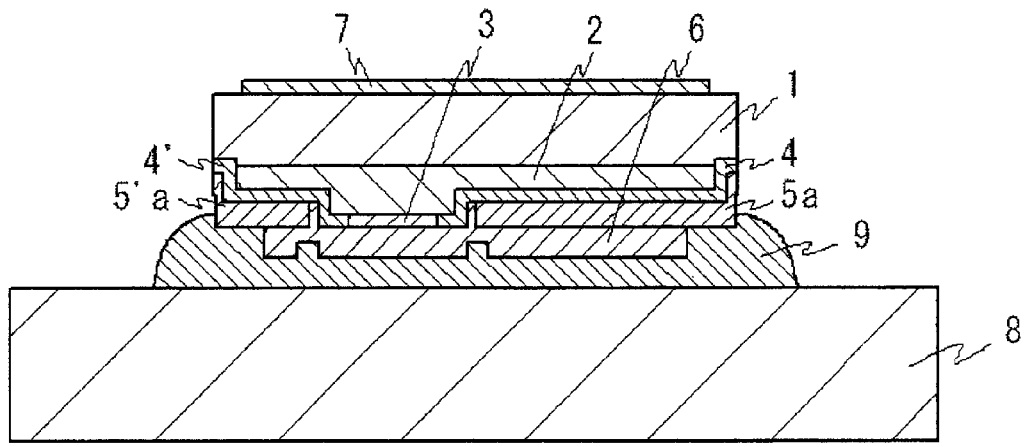
FIG. 6 is a diagram illustrating a state where a semiconductor laser element according to Embodiment 1 is mounted in a junction-down manner.

FIG. 6 shows a state of the semiconductor laser element 100 mounted on the supporting member 8 in a junction-down manner. FIG. 6 is a cross-sectional view including a first spacer 5a at the time of junction-down mounting. The semiconductor laser element 100 is connected to a wiring (not shown) of the supporting member 8, with its pad electrode 6 via the electrically conductive member 9. In the semiconductor laser element 100, the first spacer 5a is disposed on a part of the insulating layer 4 and the pad electrode 6 is disposed on the first spacer 5a. With this arrangement, inclination of the semiconductor laser element 100 in a perpendicular direction to the ridge at the time of junction-down mounting can be prevented. That is, in the case where the pad electrode 6 is directly disposed on the insulating layer 4 without interposing the first spacer 5a, the difference in the height between the upper surface of the ridge 2a and the upper surface of the insulating layer 4 increases, which increases tendency to incline. But providing the pad electrode 6 on the insulating layer 4 via the first spacer 5a enables a reduction in the difference in the height between the upper surface of the ridge 2a and the upper surface of the first spacer 5a. Thus, inclination of the laser element in a perpendicular direction to the ridge, that is, occurrence of teetering centering on the ridge can be prevented. Further, the spacer which includes the first spacer 5a is provided partially, so that without interposing the spacer, the pad electrode 6 is disposed on the insulating layer 4 which has a relatively small thickness. With this arrangement, compared to the case where the spacer is disposed on approximately entire surface, heat dissipation can be improved. That is, in the case where the spacer is disposed on the approximately entire surfaces at the both sides of the ridge 6, the spacer having a relatively large thickness and relatively poor thermal conductivity is present at approximately entire surface between the pad electrode 6 made of a metal which has a large thermal conductivity and the semiconductor layer, so that heat may be trapped in the spacer and thus the temperature in the semiconductor laser element increases. In contrast, with partially disposing the spacer, heat can be effectively conducted to the pad electrode which is on the insulating layer having a relatively small thickness, so that heat can be dissipated from the pad electrode having good thermal conductivity. As described above, with a structure in which a portion where the insulating layer is formed via the spacer and a portion where the insulating layer is formed without interposing the spacer are arranged (i.e., disposed side by side) in a direction in parallel to the longitudinal direction of the ridge 2a (for example, in a direction along line CC' shown in FIG. 1), inclination of the semiconductor laser element 100 can be prevented and further heat dissipation can be improved.

In other words, in the semiconductor laser element 100, a region for preventing inclination (that is, a region provided with the spacer) and a region for dissipating heat (that is, a region where a spacer is not provided) are separately provided in the resonator direction. With this arrangement, the both functions can be implemented at the same time in spite of a single structure.

The main components of the semiconductor laser element 100 will be described below.

(Substrate 1)

Various materials can be employed to the substrate 1. In the case where the semiconductor structure 2 is made of a nitride semiconductor, the substrate 1 is also preferably formed of a nitride semiconductor. In the embodiment, the substrate 1 has electrically conducting properties and a lower electrode 7 is formed directly on the substrate 1. The term "nitride semiconductor" refers to a semiconductor containing nitrogen, which can be typically expressed as $In_xAl_yGA_{1-X-Y}N$ ($0 \le x$, $0 \le y$, $x+y \le 1$).

(Semiconductor Portion 2)

Various materials and structures can be employed to the semiconductor portion 2. The semiconductor portion 2 can include, for example, from the substrate 1 side, a lower cladding layer, a lower guide layer, an active layer, an upper guide layer, an upper cladding layer, and an upper contact layer, in this order (not shown). Further, the semiconductor portion 2 includes a ridge 2a on its upper portion. The ridge 2a is a striped-shaped protruding portion formed in an upper side of the semiconductor portion 2, which is typically obtained by removing portions of the semiconductor portion from the upper side of the semiconductor portion 2 to an appropriate depth. Of the semiconductor portion 2, the side surfaces of the ridge 2a and the upper surfaces which are continuous with and outwardly from the side surfaces are exposed. In the specification, an "upper surface of the ridge", a "side surface of the ridge" extending from the upper surface of the ridge 2a continuously to each side of the ridge 2a, and an "upper surface of the semiconductor portion" extending from the side surface of the ridge continuously outward are indicated separately.

The semiconductor portion 2 includes an emitting end surface which is a side to emit laser beam and a reflecting end surface which is a side to reflect laser beam. In FIG. 1, the upper side is the emitting end surface and the lower side is the reflecting end surface. Each end surface can be formed by cleaving or etching. The ridge 2a is extended in a direction intersecting with each end surface (preferably, in a direction approximately perpendicular to each surface).

As shown in FIG. 2 and FIG. 3, a step portion extending in the extending direction (a direction of image depth) of the ridge 2a can be provided at the both sides of end part of the semiconductor portion 2. The step portions are covered with the insulating layers (insulating layers 4, 4'). The step portions serve as described below. That is, as shown in FIG. 6, at the time of junction-down mounting, the supporting member 8 and the pad electrode 6 are bonded with the electrically conductive member 9, but during the operation, the electrically conductive member 9 may creep up along the side surfaces of the semiconductor portion 2. For this reason, as shown in FIG. 2 and FIG. 3, step portions are formed and further, the insulating layer is disposed on the step portions. Thus, the electrically conductive member 9 can be prevented from creeping up onto the sides and occurrence of current leakage due to the creeping-up of the electrically conductive member 9 can be prevented. In order to facilitate understanding of the drawings, the step portions are not shown in FIG. 1.

The ridge 2a is preferably disposed off-set from the center of the tip. At the time of inspection of the lasing characteristics of the LD chip, in the case where a simplified method is employed in which the electrical continuity is provided through contacting a probe to the pad electrode, if the ridge is located at the center, the pad electrode disposed on the ridge may be subject to damage. Which may result in generation of a gap or the like at the time of junction-down mounting, and which may hinder heat dissipation of the portion. Particularly, heat generation on the ridge is great and thus greatly affected. For this reason, the ridge is disposed off-set from the center of the tip, which allows inspection of the lasing characteristics without contacting the probe on the ridge. The width of the region of the pad electrode for contacting the probe can be 50 μm or greater preferably 70 μm or greater.

(Upper Electrode 3)

The upper electrode 3 is an electrode disposed on the ridge 2a. The region where the upper electrode 3 and the upper surface of the ridge 2a can be appropriately designed. But, as shown in FIG. 1 etc., the contact area is preferably approximately the entire upper surface of the ridge 2a. The region for forming the upper electrode 3 is not limited to the upper surface of the ridge 2a, and can be extended on the upper surface of the semiconductor portion 2 via the insulating layers 4 and 4'. The material of the upper electrode 3 may include, for example, one of Pd, Pt, Ni, Au, Ti, W, Cu, Ag, Zn, Sn, In, Al, Ir, Rh, and ITO.

(Insulating Layers 4 and 4')

In FIG. 1, the insulating layer disposed on the right side of the ridge 2a is indicated with a reference numeral 4, and the insulating layer disposed on the left side of the ridge 2a is indicated with a reference numeral 4'. The insulating layers 4 and 4' are also called as "embedded layers" and made of a member having a refractive index lower than that of the semiconductor portion 2 so as to facilitate confinement of light in the ridge. In the case of junction-down bonding, heat is dissipated via the insulating layer 4. However, the insulating layer generally has a low thermal conductivity. For this reason, the thickness of the insulating layer is preferably as small as possible in a range so as not to affect the confinement of light. Therefore, the upper surface of the insulating layers 4 and 4' are generally located lower than the upper surface of the ridge 2a and respectively formed continuously from the upper surface of the semiconductor portion 2 to the side surfaces of the ridge 2a. The insulating layer may be formed such that a part of the insulating layers 4 and 4' are respectively extended from the side surfaces of the ridge 2a to the upper surface of the ridge 2a so that the insulating layer is formed on the upper surface of the ridge except for the region where the upper electrode 3 is formed. Examples of the material of the insulating layer include an oxide, a nitride, or an oxynitride of Si, Zr, Al, or Zn.

(Spacer)

The basic function of the spacer in the present invention is to prevent inclination of the semiconductor laser element at the time of junction-down mounting. In order to fulfill the basic function, the spacer can be provided at least a part of the upper surface of at least one of the insulating layer 4 and 4'. For example, in the case where the spacer is formed at one place, the spacer is preferably formed at a location under the pad electrode 6 and spaced apart as mush as possible from the both ends of the ridge 2a. With this arrangement, the semiconductor laser element can be supported with the ridge 2a and the spacer, which facilitates efficient prevention of inclination of the semiconductor laser element. Also, the spacer is not formed on approximately the entire surfaces of the insulating layers 4, 4' at the both sides of the ridge 2a, but partially formed. With this arrangement, while preventing the inclination at the time of mounting at the portions where the spacer is formed, at the portions where the spacer is not formed, the pad electrode is directly formed on the insulating layers 4, 4' except for the portion where the spacer is not formed, and thus, good heat conduction is secured. As for the spacer, at least one is needed as described above, but the spacer can be made up of a plurality of spacers having various functions in addition to the prevention of inclination as described above.

(First Spacers 5a and 5'a)

The first spacers 5a and 5'a shown in FIG. 1 has, in addition to basic function of prevention of inclination of the semiconductor laser element at the time of junction-down mounting, further has functions described below. In FIG. 1, the first spacers are disposed at the both sides of the ridge 2a, and of those, the first spacer disposed at the right side of the ridge 2a is indicated with the reference numeral 5a and the first spacer disposed at the left side of the ridge 2a is indicated with the reference numeral 5'a. The first spacer will be mainly described with the reference numeral 5a below, but it is needless to say that similar arrangement can be applied to the first spacer 5'a.

The first spacer 5a is disposed on a part of the insulating layer 4, and serves to space the insulating layer 4 and the pad electrode 6 apart from each other. That is, disposing the first spacer 5a between the insulating layer 4 and the pad electrode 6, the height of the upper surface of the pad electrode 6 at the side region of the ridge 2a can be increased. With this arrangement, inclination of the semiconductor laser element 100 at the time of junction-down mounting can be prevented. The semiconductor laser element 100 includes the first spacers 5a and 5'a at right and left sides of the ridge 2a, so that compared to the case where the first spacer is provided at one side of the ridge 2a, inclination of the semiconductor laser element itself can be further prevented.

Figure 12:
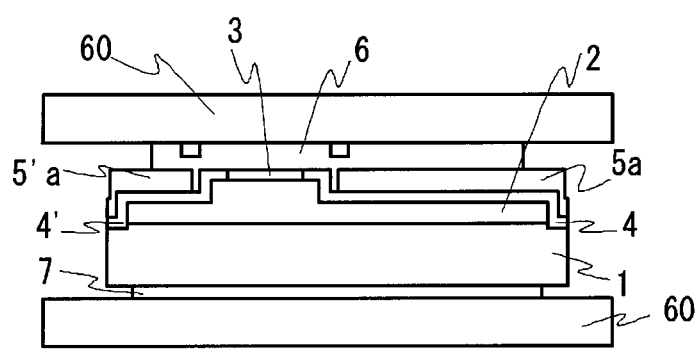
FIG. 12 is an end view showing a reflecting end surface of a semiconductor laser element according to the present invention, in forming a reflecting mirror.
Figure 13:
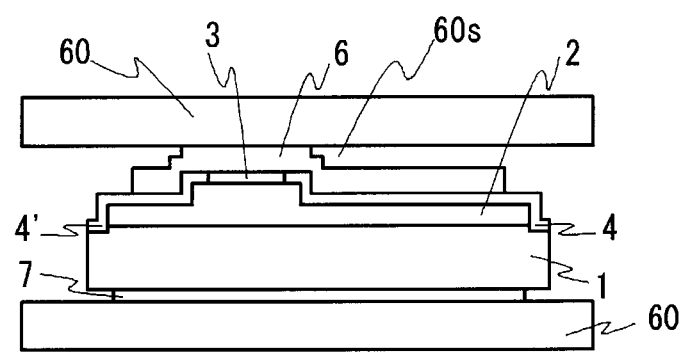
FIG. 13 is an end view showing a reflecting end surface of a conventional semiconductor laser element, in forming a reflecting mirror.

As shown in FIG. 1, the first spacer 5a can be disposed in the vicinity of one of the emitting end surface or the reflecting surface (in the present embodiment, the first spacers 5a and 5'a are disposed in the vicinity of the emitting end surface). With this arrangement, heat dissipation from the semiconductor portion 2 to the pad electrode 6-side can be further improved. That is, at the time of depositing (for example, by using sputtering) the reflecting mirror on the semiconductor laser element, as shown in FIGS. 12 and 13, a bar (a semiconductor laser element) is gripped by a plate-shaped jigs 60 and the reflecting mirror is deposited on the end surface of the semiconductor laser element. At this time, if the first spacer 5a is not provided in the vicinity of the end surface, as shown in FIG. 13, a gap 60s may be created between the jig 60 and the pad electrode 6 due to a difference in the heights between the upper surface of the upper electrode 3 and the upper surface of the insulating layer 4. Accordingly, the component of the mirror is deposited on the upper surface of the pad electrode (upper surface of the semiconductor portion 2) through the gap. As described above, if the component of the mirror is deposited on the upper surface of the pad electrode, the eutectic property between the upper surface of the pad electrode and the electrically conductive member (capable of also serving as a submount) on the submount may be damaged which may create a gap, resulting in deterioration of heat dissipation. Moreover, generally, the member constituted the mirror is made of a dielectric material having a low thermal conductivity. For this reason, heat from the semiconductor portion 2 is dissipated to the pad electrode 6 side via the mirror component, which may cause further deterioration of heat dissipation. For this reason, the first spacer 5a is formed in the vicinity of the end surface to fill a gap with the plate-shaped jig which is used at the time of deposition of mirror. Thus, deposition of the mirror component on the upper surface of the semiconductor portion 2 can be reduced and heat dissipation from the semiconductor portion 2 to the supporting member side 8 can be efficiently performed. Examples of the material of the submount include AlN and SiC. The formation of the mirror is generally performed with a plurality of element are connected with each other, but in FIG. 12 and FIG. 13, an element is used to describe.

The first spacer 5a can be disposed in the vicinity of the ridge 2a. With this arrangement, for example, deposition of the mirror component on the upper surface of the pad electrode in sputtering can be efficiently prevented, and heat dissipation from the semiconductor portion 2 to the pad electrode 6 side can be further improved. On the other hand, in the case where the ridge 2a and the first spacer 5a are spaced apart from each other, a wide step may be created between them. As a result, at the time of fixing to the planar jigs in depositing mirror, a wide gap may be created between the jig and the semiconductor portion, and through the gap portion or the gap, the mirror component may be deposited on the semiconductor portion. Particularly, in the semiconductor portion 2, the portion directly under the ridge where the current concentrates, mainly generate heat, so that heat dissipation in the vicinity of the ridge 2a of the upper surface of the semiconductor portion 2 becomes important. For this reason, disposing the first spacer 5a in the vicinity of the ridge 2a allows for prevention of deposition of the mirror component which has a poor thermal conductivity in the vicinity of the ridge, thus the heat dissipation can be further improved. The distance between the ridge 2a and the spacer is preferably less than 10 µm, more preferably less than 5 µm, further preferably less than 2 µm.

The first spacer 5a can be made of an insulating material. With this arrangement, leaking attribute to the spacer 5a can be prevented. Particularly, in the case where the first spacer 5a is disposed in the vicinity of either the emitting end surface or the reflecting end surface and the first spacer 5a is made of an electrically conductive material such as a metal which can easily expand and contract, at the time of dividing a wafer into bars or at the time of dividing the bars into individual semiconductor laser elements, a part of the first spacer 5a may expand to contact the semiconductor portion 2, resulting in occurrence of leakage. For this reason, the first spacer 5a is made of an insulating material which has a low expansion and contraction properties to prevent a contact between the first spacer 5a and the semiconductor portion 2, occurrence of leakage can be further reduced. Examples of the insulating material used for the first spacer 5a include, preferably an oxide, a nitride, or oxynitride of Si, Zr, Al, or Zn, more preferably an oxide of Si, Zr, or Al, further preferably an oxide of Si. This is because easiness in formation and a low absorption of light.

The height of the upper surface of the first spacer 5a can be approximate to the height of the upper surface of the upper electrode 3 (see FIG. 2). With this arrangement, inclination of the semiconductor laser element 100 at the time of junction-down mounting can be further prevented. This is because, disposing the upper electrode 3 and the first spacer 5a with an approximately same height allows to level the height of the upper surface of the pad electrode 6 which is deposited in a later step. For example, if the upper surface of the first spacer 5a is higher than the upper surface of the upper electrode 3, the upper surface of the pad electrode 6 which is deposited in a later step will be higher than the upper surface of the upper electrode 3 on the first spacer 5a. As a result, at the time of fixing to the planar jigs in depositing mirror on the upper electrode 3, a gap may be created and the mirror component may be deposited in the gap. On the other hand, if the upper surface of the first spacer 5a is lower than the upper surface of the upper electrode 3, the upper surface of the pad electrode 6 which is deposited in a later step will be lower than the upper surface of the upper electrode 3 on the first spacer 5a. As a result, at the time of fixing to the planar jigs in depositing mirror on the first spacer 5a, a gap may be created and the mirror component may be deposited in the gap. Thus, the height of the upper electrode 3 and the height of the first spacer 5a are preferably approximated to a degree so that the mirror component is not deposited through the gap. The difference in the height between the both is preferably less than 50 nm, more preferably less than 30 nm.

(Second Spacers 5b and 5'b)

On the upper surface of the insulating layer where the first spacer is disposed, a second spacer can be further disposed. In FIG. 1, the second spacer disposed on the right side of the ridge 2a is indicated with a reference numeral 5b, and the second spacer disposed on the left side of the ridge 2a is indicated with a reference numeral 5'b. The second spacer will be mainly described with the reference numeral 5b below, but it is needless to say that similar arrangement can be applied to the second spacer 5'b.

The second spacer 5b serves to space the insulating layer 4 and the pad electrode 6 apart from each other. Disposing the second spacer 5b between the insulating layer 4 and the pad electrode 6, the height of the upper surface of the pad electrode 6 at the side region of the ridge 2a can be increased. With this arrangement, teetering which occurs centering around the central axis in the longitudinal direction of the ridge can be prevented, and in addition to this, inclination of the semiconductor laser element 100 in the resonator length direction at the time of junction-down mounting can also be prevented (teetering centering around the central axis perpendicularly intersect to the central axis in the longitudinal direction of the ridge can be prevented). That is, in the case where only the first spacer 5a is formed on the insulating layer 4, the region except the ridge 2a is supported at one point of the first spacer 5a via the pad electrode 6, but with further disposing the second spacer 5b, supporting can be obtained with two point in the resonator direction, so that junction-down mounting can be performed more stably.

As shown in FIG. 1, in the case where the first spacer 5a is disposed in the vicinity of either one of the emitting end surface or the reflecting surface, the second spacer 5b can be disposed in the vicinity of the other one of the emitting end surface or the reflecting end surface (in the present embodiment, the first spacer 5a and 5'a are disposed in the vicinity of the emitting end surface and the second spacers 5b and 5'b are disposed in the vicinity of the reflecting end surface). With this arrangement, heat dissipation can be further improved. The similar reason as in the first spacer 5a can be applied, so that repetitive description of which will be omitted.

The second spacer 5b can be disposed in the vicinity of the ridge 2a. With this arrangement, heat dissipating properties can be further improved. The similar reason as in the first spacer 5a can be applied, so that repetitive description of which will be omitted.

The second spacer 5b can be made of an insulating material. With this arrangement, leakage attributed to the first spacer 5a can be prevented. The similar reason as in the first spacer 5a can be applied, so that repetitive description of which will be omitted.

The upper surface of the second spacer 5b can be an approximately same height as the upper surface of the upper electrode 3 (see FIG. 2). With this arrangement, inclination of the semiconductor laser element 100 at the time of junction-down mounting can be further prevented. The similar reason as in the first spacer 5a can be applied, so that repetitive description of which will be omitted.

(Blocking Portion 5c and 5'c)

In FIG. 1, a blocking portion disposed on the right side of the ridge 2a is indicated with a reference numeral 5c, and a blocking portion disposed on the left side of the ridge 2a is indicated with a reference numeral 5'c. The blocking portion 5c disposed on the right side of the ridge 2a will be mainly described below. It is needless to say that similar description can be applied to the blocking portion 5'c disposed on the left side of the ridge 2a.

The blocking portion 5c is formed, in a direction perpendicular to the ridge 2a, on the insulating layer 4 and spaced apart from the pad electrode 6, and a recessed portion is defined between the pad electrode 6 and the blocking portion 5c (see FIG. 3). With the recessed portion, excessive expansion of the electrically conductive member at the time of junction-down mounting can be avoided, so that occurrence of leakage attributed to the electrically conductive member can be prevented.

In FIG. 1, the first spacer 5a, the second spacer 5b, and the blocking portion 5c are formed integrally, but those members can be disposed separately. In the case where the first spacer 5a, the second spacer 5b, and the blocking portion 5c are integrally formed, the portion connecting the first spacer 5a and the second spacer 5b is indicated as the blocking portion 5c.

(Pad Electrode 6)

The pad electrode 6 covers at least the first spacer 5a and the insulating layer 4 on a straight line in the resonator direction. The pad electrode 6 is not needed to cover the entire upper surface of the first spacer 5a, but is sufficient to cover at least a part of the upper surface of the first spacer 5a. As shown in FIG. 4, the upper surface of the pad electrode 6 disposed on the upper surface of the semiconductor portion 2 via the first spacer 5a is higher than the upper surface of the pad electrode 6 disposed on the upper surface of the semiconductor portion 2 disposed without interposing the first spacer 5a. The material of the pad electrode 6 can be a metal material having a good thermal conductivity, and for example, at least one of Ni, Ti, Au, Pt, Pd, and W can be contained.

As shown in FIG. 1 etc., the pad electrode 6 can, in the resonator direction, integrally cover the upper surface of the spacer 5a, the upper surface of the insulating layer 4, and the upper surface of the second spacer 5b. This is because formation of the pad electrode 6 itself is easy and a large heat dissipating region (a region where the pad electrode 6 is in direct contact with the insulating layer 4) can be secured.

(Other Embodiments)

Figure 7:
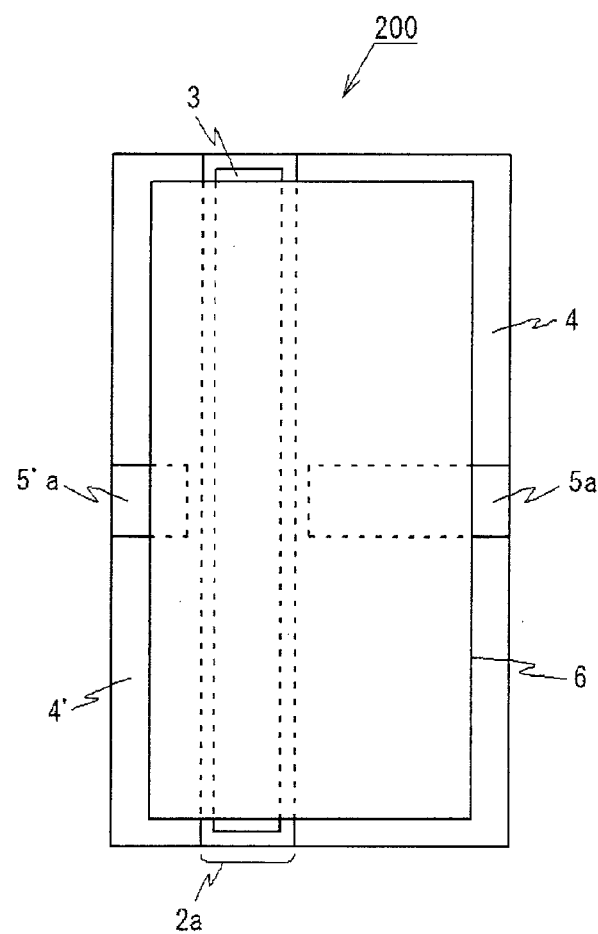
FIG. 7 is a plan view of a semiconductor laser element according to Embodiment 2.

As a different embodiment from that of the semiconductor laser element 100, a structure as a semiconductor laser element 200 shown in FIG. 7 can be employed. The semiconductor laser element 200 has a spacer 50 on the insulating layer 4 and does not have the second spacer and the blocking portion. Further, the spacer 50 is not disposed in the vicinity of the end surfaces but disposed at a center portion in the extending direction of the ridge 2a. With this structure, an improvement of heat dissipation. by preventing the mirror material from reaching nor an effect of the blocking portion which prevents leaking is not expected but prevention of inclination of the semiconductor laser element 200 at the time of junction-down mounting and heat dissipation. can be expected to a certain degree.

EXAMPLES

Example

First, on a wafer substrate 1 made of an n-type GaN, an under layer of Si-doped $Al_{0.02}Ga_{0.98}N$ (1.6 μm in thickness), a crack prevention layer of Si-doped $In_{0.05}Ga_{0.95}N$ (0.15 μm in thickness), a lower cladding layer of Si-doped $Al_{0.07}Ga_{0.93}N$ (0.9 μm in thickness), a lower guiding layer made of Si-doped GaN (0.15 μm in thickness) and undoped GaN (0.15 μm in thickness), an active layer of MQW, a carrier confinement layer made of Mg-doped $Al_{0.12}Ga_{0.88}N$ (1.5 nm in thickness) and Mg-doped $Al_{0.16}Ga_{0.84}N$ (8.5 nm in thickness), an upper guiding layer made of undoped GaN (0.15 μm in thickness) and Mg-doped GaN (0.35 μm in thickness), and an upper contact layer of Mg-doped GaN (15 nm in thickness) are stacked in the order to obtain a semiconductor portion 2. The MQW active layer includes, in the order from the substrate 1 side, a barrier layer of Si-doped $In_{0.03}Ga_{0.97}N$ (170 nm in thickness), a well layer of undoped $In_{0.14}Ga_{0.86}N$ (3 nm in thickness), a barrier layer of undoped GaN (14 nm in thickness), a well layer of undoped $In_{0.14}Ga_{0.86}N$ (3 nm in thickness), and a barrier layer of undoped $In_{0.03}Ga_{0.97}N$ (70 nm in thickness).

Next, a stripe-shaped ridge 2a having a width of 30 μm is formed by using RIE, to a depth of 500 nm which exposes the upper guiding layer.

Next, on the ridge 2a, an upper electrode 3 made of ITO is formed with a thickness of 200 nm. The upper electrode 3 is, as shown in FIGS. 1 to 3, and 5, bonded with the upper surface of the ridge 2a except for the peripheral region of the upper surface of the ridge 2a.

Next, an insulating layers 4 and 4' made of SiO$_2$ are formed with a thickness of 200 nm. The insulating layers 4 and 4a cover, as shown in FIGS. 1 to 4, the upper surface of the semiconductor portion 2, the side surfaces of the ridge 2a, and the peripheral region of the upper surface of the ridge 2a.

Next, the first spacers 5a and 5'a, the second spacers 5b and 5'b, and blocking portions 5c and 5'c each made of SiO$_2$ are formed with a thickness of 500 nm, respectively. The first spacer 5a, the second spacer 5b, and the blocking portion 5c are formed integrally, and in a same manner, the first spacer 5'a, the second spacer 5'b, and the blocking portion 5'c are also formed integrally. The distance between each spacer and the ridge 2a was 5 µm. In this state, the insulating layer 4 is exposed between the first spacer 5a and the second spacer 5b, and the insulating layer 4' is exposed between the first spacer 5'a and the second spacer 5'b.

Next, the pad electrode 6 made of Ni (8 nm in thickness)/Pd (200 nm in thickness)/Au (800 nm in thickness)/Pt (200 nm in thickness)/Au (300 nm in thickness) is formed. The pad electrode 6 has a rectangular shape in a plan view (FIG. 1), and covers not only the upper electrode 3 but also the first spacers 5a and 5'a, the second spacers 5b and 5'b, the insulating layer 4 exposed between the first spacer 5a and the second spacer 5b, and the insulating layer 4' exposed between the first spacer 5'a and the second spacer 5'b. The final layer of Au having a thickness of 300 nm is alloyed with AuSn to form a eutectic alloy at the time of junction-down mounting.

Next, the lower electrode 7 made of Ti (6 nm in thickness)/Au (200 nm in thickness)/Pt (200 nm in thickness)/Au (300 nm in thickness) is formed on the lower surface of the substrate 1.

The wafer having the structure described above was polished on the substrate side to a thickness of 80 µm, then, the wafer was cleaved into a bar-shape using the M-plane as a cleavage plane to form a plurality of bar-shaped wafers. In detail, between the two bar-shaped wafer, SiO$_2$ formed bridging adjacent two elements is divided in two at its center, the first spacer 5a of one element and the second spacer 5b of the other element were formed at the same time (the first spacer 5'a and the second spacer 5'b were obtained in a similar manner). The length of the spacers 5a, 5'a, 5b, and 5'b along the resonator direction in each laser element was 25 µm respectively. A side surface of each of the first spacers 5a and 5'a is on the same plane with the emitting end surface of the semiconductor portion 2. Similarly, a side surface of each of the second spacers 5b and 5'b is on the same plane with the reflecting end surface of the semiconductor portion.

Next, on the emitting end surface of the bar-shaped wafer, Al$_2$O$_3$ is formed with a thickness of 132 nm to obtain an emitting end surface protective layer (emitting-side mirror). Also, on the reflecting end surface of the bar-shaped wafer, ZrO$_2$ is formed with a thickness of 50 nm and then six pairs of SiO$_2$ (74 nm in thickness)/ZrO$_2$ (50 nm in thickness) are formed to obtain a reflecting end surface protecting layer (reflecting-side mirror).

Next, in a direction in parallel to the ridge, the bar-shaped wafer is divided to obtain semiconductor laser elements 100 respectively with a resonator length (a length in a direction parallel to the ridge) of 1200 µm and a width (a length in a direction perpendicular to the ridge) of 150 µm were obtained.

Further, the semiconductor laser element 100 is mounted in a junction-down manner on a submount 8 which is a supporting member made of AlN provided with a wiring. For the electrically conductive member 6, an AuSn eutectic alloy was used. The semiconductor laser element 100 according to an example fabricated as described above was obtained through a stable mounting in which inclination was efficiently prevented at the time of junction-down mounting. The mounted semiconductor laser device was operated and multi-mode lasing with the dominant lasing wavelength of 445 nm was confirmed.

Comparative Example

Figure 11:
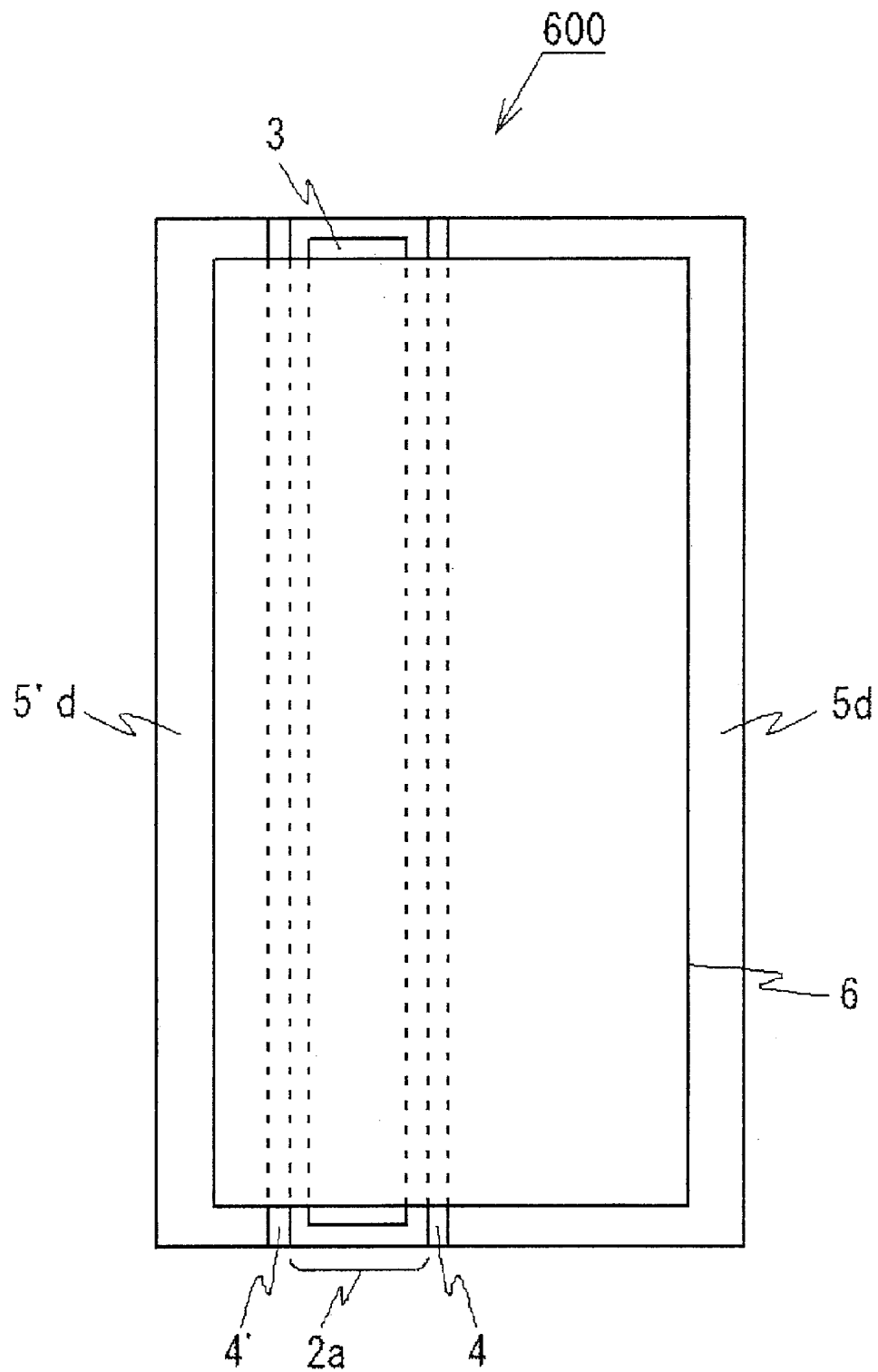
FIG. 11 is a plan view of a semiconductor laser element according to Comparative Example.

In order to efficiently prevent inclination at the time of junction-down mounting, another structure can be considered in which, SiO$_2$ is formed with a thickness of 500 nm on approximately the entire surface of the both sides of the ridge 2a, and the entire surface of the pad electrode 6 is made substantially flat. However, with such a structure, the heat dissipation deteriorates as described above. In order to confirm the above, as Comparative Example, as shown in FIG. 11, a semiconductor laser element 600 was fabricated, in which SiO$_2$ is formed uniformly on the approximately entire surfaces of the insulating layers 4 and 4' at the both sides of the ridge 2a, and the heat dissipation. was compared with that of the semiconductor element according to the Example. That is, the semiconductor laser element 600 of Comparative Example has a structure similar to that of the semiconductor laser element 100, except that instead of the first spacers 5a, 5'a, the second spacers 5b, 5'b, and the blocking portions 5c, 5'c which are formed as surrounding the outer periphery of the semiconductor laser element of Example, SiO$_2$ which covers approximately the entire surface of the insulating layers 4, 4' is formed on the both sides of the ridge 2a.

Evaluation

Figure 8:
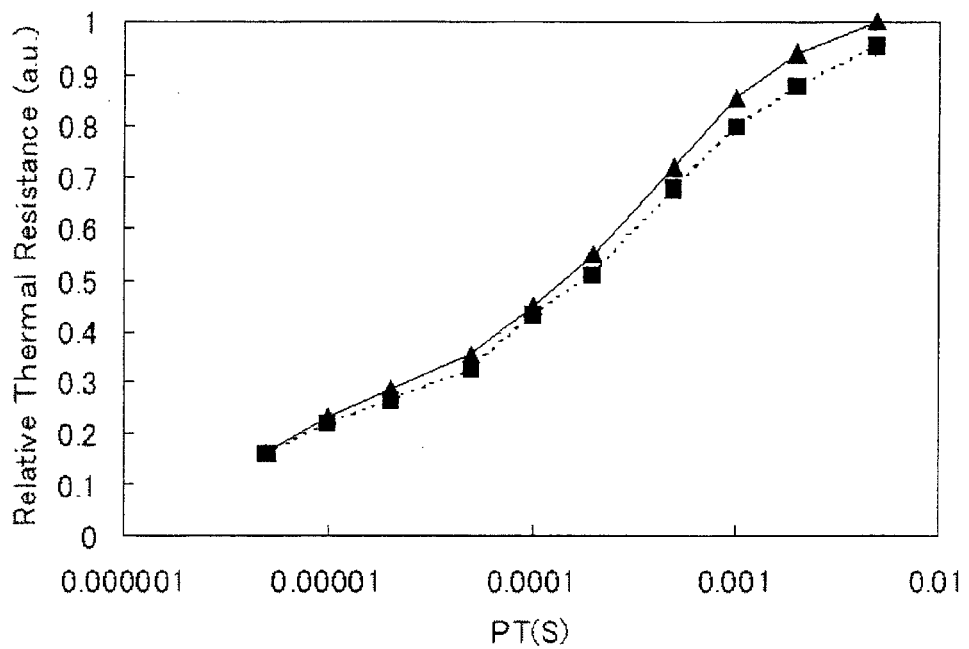
FIG. 8 is a graph showing transient heat resistant measurements of Example and Comparative Example.

FIG. 8 is a graph showing a result of transient thermal resistance measurement. The graph shows relative values of thermal resistance along the vertical axis and values of applied pulse current along the horizontal axis. A difference was observed in the thermal resistance values at about PT=0.01 Sec which is considered to indicate the thermal resistance value between the chip and the submount, and smaller values than that of Comparative Example was confirmed. From the result, superior heat dissipation between the semiconductor laser element 100 and the submount compared to that of Comparative Example can be understood. The difference in the thermal resistance may be seen as small, but in a W-class high-power semiconductor laser element, a great amount of heat is generated in a high current region, so that a minute difference in the thermal resistance produces a great difference in the amount of heat generation. It will be understood with the description below, that even with the minute difference as shown above, a great difference in the I-L characteristics and the life-characteristics result.

Figure 9:
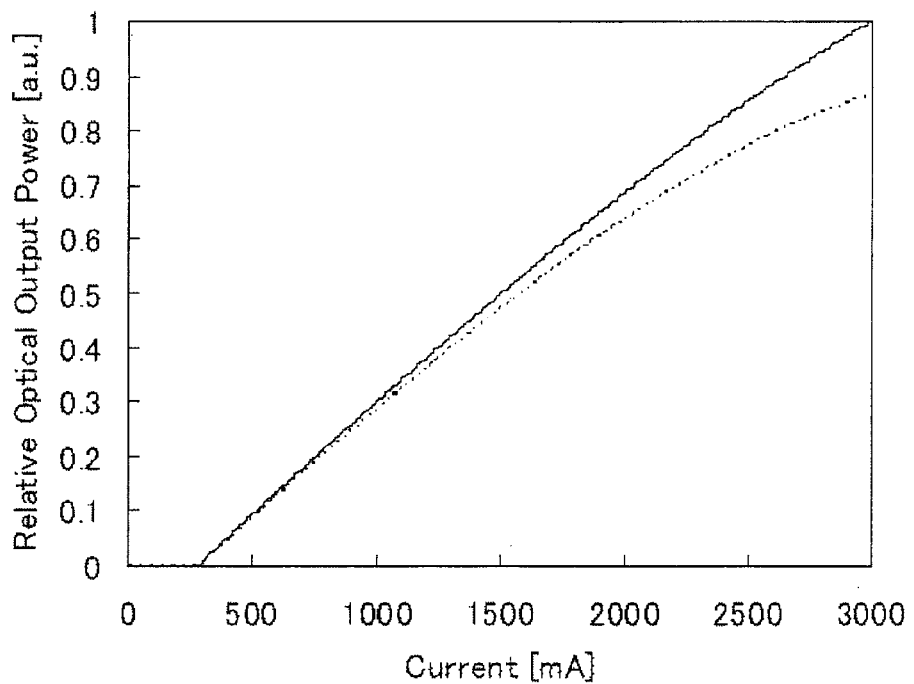
FIG. 9 is a graph showing the I-L characteristics of Example and Comparative Example.

FIG. 9 is a graph showing the I-L characteristics (current-optical output characteristics) of Example and Comparative Example. The solid line represents Example and the dashed line represents Comparative Example. FIG. 9 shows values of current along the horizontal axis and values of relative optical output power along the vertical axis. As seen from the FIG. 9, in Example, greater the current value the greater improvement in the optical output can be obtained in proportion to the current value, but in Comparative Example, the optical output is not improved in a linear manner even the current value is increased. This result is considered to be because the heat dissipation in Example is superior to that of Comparative Example.

Figure 10:
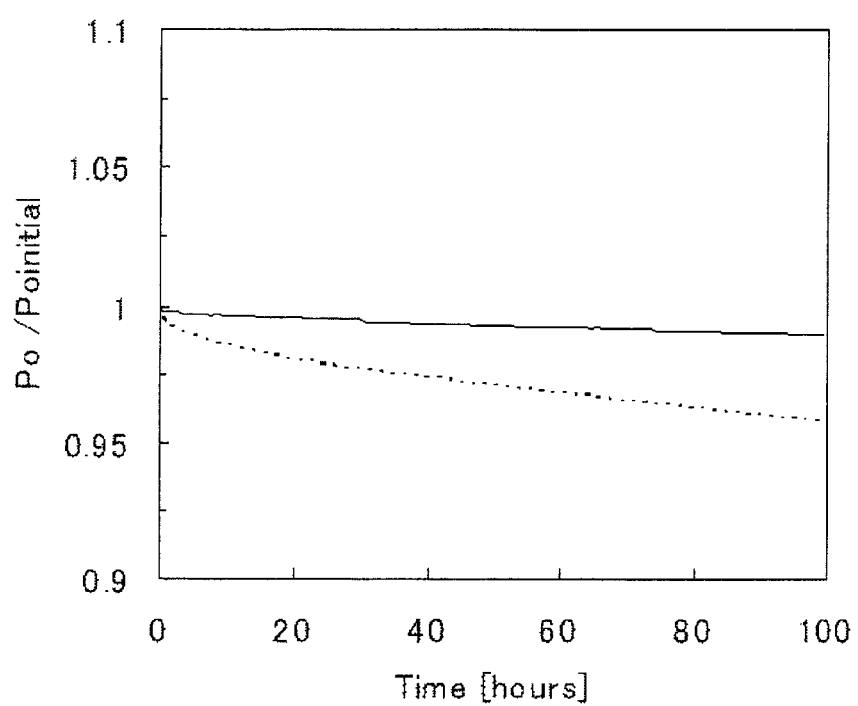
FIG. 10 is a graph showing the life characteristics of Example and Comparative Example.

FIG. 10 is a graph showing the life characteristics of Example and Comparative Example. The solid line represents Example and the dashed line represents Comparative Example. FIG. 10 shows values of operation time along the horizontal axis and values of relative optical output power along the vertical axis. As seen from FIG. 9, in Example, a small decrease in the optical output is observed even with a long-time operation, but a large drop in the optical power with a long-time operation is observed in Comparative Example. This result is considered that the heat dissipation in Example is superior to that of Comparative Example. As described above, in the semiconductor laser element 100 of Example according to the present invention exhibit a proof that inclination at the time of junction-down bonding can be prevented and also has a high heat dissipation.

DENOTATION OF REFERENCE NUMERALS 100, 200 . . . semiconductor laser element
1 . . . substrate
2 . . . semiconductor portion
3 . . . upper electrode
4, 4' . . . insulating layer
5a, 5'a . . . first spacer
5b, 5'b . . . second spacer
5c, 5'c . . . connecting portion
6 . . . pad electrode
7 . . . lower electrode
8 . . . supporting member
9 . . . electrically conductive member

The invention claimed is:

1. A semiconductor laser element having an emitting side a reflecting side, an upper side, a lower side, and lateral sides the semiconductor laser element comprising:
a substrate;
a semiconductor portion disposed on the substrate, the semiconductor portion having a ridge on a surface on a side opposite to the substrate, the ridge extending in a direction between the emitting side and the reflecting side of the semiconductor laser element;
an electrode disposed on the ridge;
an insulating layer disposed on the semiconductor portion at both lateral sides of the ridge; and
a pad electrode, at least a portion of the pad electrode being disposed on the electrode, and at least a portion of the pad electrode being, disposed above the insulating layer; and
at least one spacer, the at least one spacer including:
at least one emitting side spacer portion located on the insulating layer at an emitting side portion of the pad electrode, and
at least one reflecting side spacer portion located on the insulating layer at a reflecting side portion of the pad electrode,
wherein, in at least one cross-section of the semiconductor laser element that extends in the direction between the emitting side and the reflecting side of the semiconductor laser element and in a direction between the upper side and the lower side of the semiconductor laser element, (i) the pad electrode is disposed directly on the at least one emitting side spacer portion at the emitting side portion of the pad electrode, (ii) the pad electrode is disposed directly on the at least one reflecting side spacer portion at the reflecting side portion of the pad electrode, and (iii) the pad electrode is disposed directly on the insulating layer at an intermediate portion of the pad electrode located between the emitting side portion and the reflecting side portion of the pad electrode.

2. The semiconductor laser element according to claim 1, wherein the at least one emitting side spacer portion includes emitting side spacer portions located on both lateral sides of the ridge.

3. The semiconductor laser element according to claim 2, wherein the at least one reflecting side spacer portion includes reflecting side spacer portions located on both lateral sides of the ridge.

4. The laser element according to claim 1, further comprising at least one blocking portion arranged in parallel to the ridge along an side surface of the substrate, a height of the at least one blocking portion being substantially the same as a height of the spacer.

5. The semiconductor laser element according to claim 4, wherein the blocking portion comprises at least one of an oxide of Si, an oxide of Zr, an oxide of Al, an oxide of Zn, a nitride of Si, a nitride of Zr, a nitride of Al, a nitride of Zn, an oxynitride of Si, an oxynitride of Zr, an oxynitride of Al and an oxynitride of Zn.

6. The laser element according to claim 3, further comprising at least one blocking portion arranged in parallel to the ridge along an side surface of the substrate, a height of the at least one blocking portion being substantially the same as a height of the spacer.

7. The semiconductor laser element according to claim 4, wherein the at least one emitting side spacer portion, the at least one reflecting side spacer portion, and the blocking portion are formed integrally.

8. The semiconductor laser element according to claim 1, wherein the at least one spacer is made of an insulating material.

9. The semiconductor laser element according to claim 1, wherein an upper surface of the pad electrode located on the ridge and an upper surface of the pad electrode located above the spacer are at a substantially same height.

10. The semiconductor laser element according to claim 3, wherein an upper surface of the pad electrode located on the ridge and an upper surface of the pad electrode located above the spacer are at a substantially same height.

11. The semiconductor laser element according to claims 1, wherein the spacer comprises at least one of an oxide of Si, an oxide of Zr, an oxide of Al, an oxide of Zn, a nitride of Si, a nitride of Zr, a nitride of Al, a nitride of Zn, an oxynitride of Si, an oxynitride of Zr, an oxynitride of Al and an oxynitride of Zn.

12. The semiconductor laser element according to claim 1, further comprising a step portion extending in the same direction as the ridge, wherein the insulating layer is formed on the step portion.

13. The semiconductor laser element according to claim 3, further comprising a step portion extending in the same direction as the ridge, wherein the insulating layer is formed on the step portion.

14. The semiconductor laser element according to claim 1, wherein the semiconductor laser element is a multi-mode laser diode.

15. The semiconductor laser element according to claim 3, wherein the semiconductor laser element is a multi-mode laser diode.

16. The semiconductor laser element according to claim 1, wherein the insulating layer is made of at least one of an oxide of Si, an oxide of Zr, an oxide of Al, an oxide of Zn, a nitride of Si, a nitride of Zr, a nitride of Al, a nitride of Zn, an oxynitride of Si, an oxynitride of Zr, an oxynitride of Al and an oxynitride of Zn.

17. The semiconductor laser element according to claim 1, wherein the ridge and the at least one emitting side spacer portion are spaced apart from each other.

18. The semiconductor laser element according to claim 17, wherein a distance between the ridge and the at least one emitting side spacer portion is less than 10 μm.

19. The semiconductor laser element according to claim 1, wherein the semiconductor structure comprises a nitride semiconductor.

20. A semiconductor laser element having an emitting side and a reflecting side, the semiconductor laser element comprising:
   a substrate;
   a semiconductor portion disposed on the substrate, the semiconductor portion having a ridge on a surface on a side opposite to the substrate, the ridge extending in a direction between the emitting side and the reflecting side of the semiconductor laser element;
   an electrode disposed on the ridge;
   an insulating layer disposed on the semiconductor portion at both lateral sides of the ridge; and
   a pad electrode, at least a portion of the pad electrode being disposed on the electrode, and at least a portion of the pad electrode being disposed over the insulating layer; and
   at least one spacer, the at least one spacer including:
      at least one emitting side spacer portion located between the insulating layer and the pad electrode at an emitting side portion of the pad electrode, and
      at least one reflecting side spacer portion located between the insulating layer and the pad electrode at a reflecting side portion of the pad electrode,
   wherein, in at least one cross-section of the semiconductor laser element that is (i) perpendicular to the direction in which the ridge extends, and (ii) located between the emitting side portion of the pad electrode and the reflecting side portion of the pad electrode, no portion of the at least one spacer is located between the insulating layer and the pad electrode.

* * * * *